United States Patent
Ko

(10) Patent No.: US 9,012,251 B2
(45) Date of Patent: Apr. 21, 2015

(54) METHOD FOR PREVENTING SHORT CIRCUIT BETWEEN METAL WIRES IN ORGANIC LIGHT EMITTING DIODE DISPLAY DEVICE

(71) Applicant: Shenzhen China Star Optoelectronics Technology Co., Ltd., Shenzhen (CN)

(72) Inventor: Kai-Yuan Ko, Shenzhen (CN)

(73) Assignee: Shenzhen China Star Optoelectronics Technology Co. Ltd., Shenzhen (CN)

( * ) Notice: Subject to any disclaimer, the term of this patent is extended or adjusted under 35 U.S.C. 154(b) by 0 days.

(21) Appl. No.: 14/235,804

(22) PCT Filed: Nov. 28, 2013

(86) PCT No.: PCT/CN2013/088052
§ 371 (c)(1),
(2) Date: Jan. 29, 2014

(87) PCT Pub. No.: WO2015/024320
PCT Pub. Date: Feb. 26, 2015

(65) Prior Publication Data
US 2015/0050766 A1     Feb. 19, 2015

(51) Int. Cl.
*H01L 21/00* (2006.01)
*H01L 51/56* (2006.01)
*H01L 27/32* (2006.01)

(52) U.S. Cl.
CPC ............ *H01L 51/56* (2013.01); *H01L 27/3276* (2013.01); *H01L 2251/5392* (2013.01)

(58) Field of Classification Search
CPC ... H01L 27/28; H01L 27/288; H01L 27/3202; H01L 27/3204; H01L 27/3225; H01L 27/3276; H01L 51/56; H01L 2251/5392
USPC .......................... 438/29, 34, 42, 99, 608, 609
See application file for complete search history.

(56) References Cited

U.S. PATENT DOCUMENTS

| | | | |
|---|---|---|---|
| 7,554,260 B2 * | 6/2009 | Sakakura et al. | 313/503 |
| 8,890,151 B2 * | 11/2014 | Hong | 257/59 |
| 8,896,014 B2 * | 11/2014 | Tanaka et al. | 257/99 |
| 2004/0009627 A1 | 1/2004 | Lee et al. | |
| 2012/0326151 A1 * | 12/2012 | Zhan et al. | 257/59 |
| 2014/0217386 A1 * | 8/2014 | Hayashi | 257/40 |

FOREIGN PATENT DOCUMENTS

CN         101075579 A     11/2007

* cited by examiner

*Primary Examiner* — Kevin M Picardat
(74) *Attorney, Agent, or Firm* — Mark M. Friedman

(57) ABSTRACT

Disclosed is a method for preventing a short circuit between metal wires in an organic light emitting diode display device. The method includes: forming an inorganic layer on a substrate; forming an opening in the inorganic layer for exposing a part of the substrate; forming a metal layer on the inorganic layer, the metal layer including two metal wires respectively positioned at two sides of the opening; forming an organic layer on the two metal wires of the metal layer; and forming an indium tin oxide layer on the organic layer. The present invention can ensure that the short circuit does not occur between the metal wires by forming the opening in the inorganic layer.

13 Claims, 6 Drawing Sheets

METHOD FOR PREVENTING SHORT CIRCUIT BETWEEN METAL WIRES IN ORGANIC LIGHT EMITTING DIODE DISPLAY DEVICE

BACKGROUND OF THE INVENTION

1. Field of the Invention

The present invention generally relates to an organic light emitting diode display device field, and more particularly to a method for preventing a short circuit between metal wires in an organic light emitting diode display device.

2. Description of Prior Art

An organic light emitting diode (OLED) display device has advantages of self-luminescent, lower power consumption, and wide viewing angle, and thus the organic light emitting diode display device is regarded as a display device with high development potential in the future.

Please refer to FIG. 1 and FIG. 2. FIG. 1 illustrates a top view of some elements of a conventional organic light emitting diode display device. FIG. 2 illustrates a cross-sectional view along a line AA' in FIG. 1.

In a manufacturing process of the organic light emitting diode display device, a plurality of thin film transistors which are served as switch elements are manufactured on a substrate (not shown) firstly, and then organic light emitting diodes which are served as light emitting elements are manufactured.

Manufacturing the thin film transistors and the light emitting diodes comprises the following steps. Firstly, a gate layer (not shown) and a semiconductor layer (not shown) are formed on the substrate (not shown). Then, an inorganic layer 100 is formed, and a metal layer is formed on the inorganic layer 100. The metal layer comprises metal wires 102 and 104 for respectively transmitting independent signals, that is, for transmitting different signals. An organic layer 106 is formed on the metal wires 102 and 104. An indium tin oxide (ITO) layer 108 is formed on the organic layer 106. The indium tin oxide layer 108 is utilized as an anode of an organic light emitting diode. Finally, a light emitting layer (now shown) and a cathode (not shown) are formed on the indium tin oxide layer 108.

However, in the manufacturing process of the organic light emitting diode display device, a photoresist layer (not shown) is formed on the indium tin oxide layer 108 after the indium tin oxide layer 108 is deposited. During an exposure step, a top of the organic layer 106 masks out a bottom of the indium tin oxide layer 108 because the organic layer 106 is too thick. Accordingly, the bottom of the indium tin oxide layer 106 cannot be irradiated by light. That is, the organic layer 106 generates shadowing effect. As a result, after an etching step is performed and the photoresist layer (not shown) is removed, a fraction of the indium tin oxide layer 108 is left as shown in FIG. 2, so that a short circuit occurs between the metal wires 102 and 104.

Consequently, there is a need to solve the problem that the short circuit occurs between the metal wires 102 and 104 because the fraction of the indium tin oxide layer 108 is left.

SUMMARY OF THE INVENTION

An objective of the present invention is to provide a method for preventing a short circuit between metal wires in an organic light emitting diode display device capable of solving the problem that a short circuit occurs between metal wires because an indium tin oxide layer is left.

To solve the above-mentioned problem, a method for preventing a short circuit between metal wires in an organic light emitting diode display device provided by the present invention comprises:

forming an inorganic layer on a substrate;

forming an opening in the inorganic layer for exposing a part of the substrate, the opening having a shape with narrow top and wide bottom;

forming a metal layer on the inorganic layer, the metal layer comprising two metal wires respectively positioned at two sides of the opening;

forming an organic layer on the two metal wires of the metal layer, the organic layer at least covering a part of the two metal wires; and forming an indium tin oxide layer on the organic layer.

In the method for preventing the short circuit between the metal wires in the organic light emitting diode display device of the present invention, the step of forming the opening in the inorganic layer for exposing the part of the substrate comprises:

coating a negative photoresist layer on the inorganic layer;

performing an exposure step to the negative photoresist layer by utilizing a photo mask, so that the negative photoresist layer corresponding to a position of the opening is not irradiated by light;

performing a development step to the negative photoresist layer for removing the negative photoresist layer corresponding to the position of the opening; and performing an etching step to remove the inorganic layer corresponding to the position of the opening.

After the step of performing the etching step to remove the inorganic layer corresponding to the position of the opening, the method for preventing the short circuit between the metal wires in the organic light emitting diode display device of the present invention further comprises a step of:

stripping the negative photoresist layer on the inorganic layer.

In the method for preventing the short circuit between the metal wires in the organic light emitting diode display device of the present invention, the two metal wires are utilized as sources.

In the method for preventing the short circuit between the metal wires in the organic light emitting diode display device of the present invention, the two metal wires are utilized as drains.

In the method for preventing the short circuit between the metal wires in the organic light emitting diode display device of the present invention, the two metal wires are formed by a wet etching method.

To solve the above-mentioned problem, a method for preventing a short circuit between metal wires in an organic light emitting diode display device provided by the present invention comprises:

forming an inorganic layer on a substrate;

forming an opening in the inorganic layer for exposing a part of the substrate;

forming a metal layer on the inorganic layer, the metal layer comprising two metal wires respectively positioned at two sides of the opening;

forming an organic layer on the two metal wires of the metal layer; and forming an indium tin oxide layer on the organic layer.

In the method for preventing the short circuit between the metal wires in the organic light emitting diode display device of the present invention, the step of forming the opening in the inorganic layer for exposing the part of the substrate comprises:

coating a negative photoresist layer on the inorganic layer;

performing an exposure step to the negative photoresist layer by utilizing a photo mask, so that the negative photoresist layer corresponding to a position of the opening is not irradiated by light;

performing a development step to the negative photoresist layer for removing the negative photoresist layer corresponding to the position of the opening; and performing an etching step to remove the inorganic layer corresponding to the position of the opening.

After the step of performing the etching step to remove the inorganic layer corresponding to the position of the opening, the method for preventing the short circuit between the metal wires in the organic light emitting diode display device of the present invention further comprises a step of:

stripping the negative photoresist layer on the inorganic layer.

In the method for preventing the short circuit between the metal wires in the organic light emitting diode display device of the present invention, the two metal wires are utilized as sources.

In the method for preventing the short circuit between the metal wires in the organic light emitting diode display device of the present invention, the two metal wires are utilized as drains.

In the method for preventing the short circuit between the metal wires in the organic light emitting diode display device of the present invention, the organic layer at least covers a part of the two metal wires.

In the method for preventing the short circuit between the metal wires in the organic light emitting diode display device of the present invention, the two metal wires are formed by a wet etching method.

Compared with the prior arts, the method for preventing the short circuit between the metal wires in the organic light emitting diode display device of the present invention can ensure that the short circuit does not occur between the metal wires by forming the opening in the inorganic layer.

For a better understanding of the aforementioned content of the present invention, preferable embodiments are illustrated in accordance with the attached figures for further explanation:

DETAILED DESCRIPTION OF THE INVENTION

The following descriptions for the respective embodiments are specific embodiments capable of being implemented for illustrations of the present invention with referring to appended figures. For example, the terms of up, down, front, rear, left, right, interior, exterior, side, etcetera are merely directions of referring to appended figures. Therefore, the wordings of directions are employed for explaining and understanding the present invention but not limitations thereto.

Figure 3:
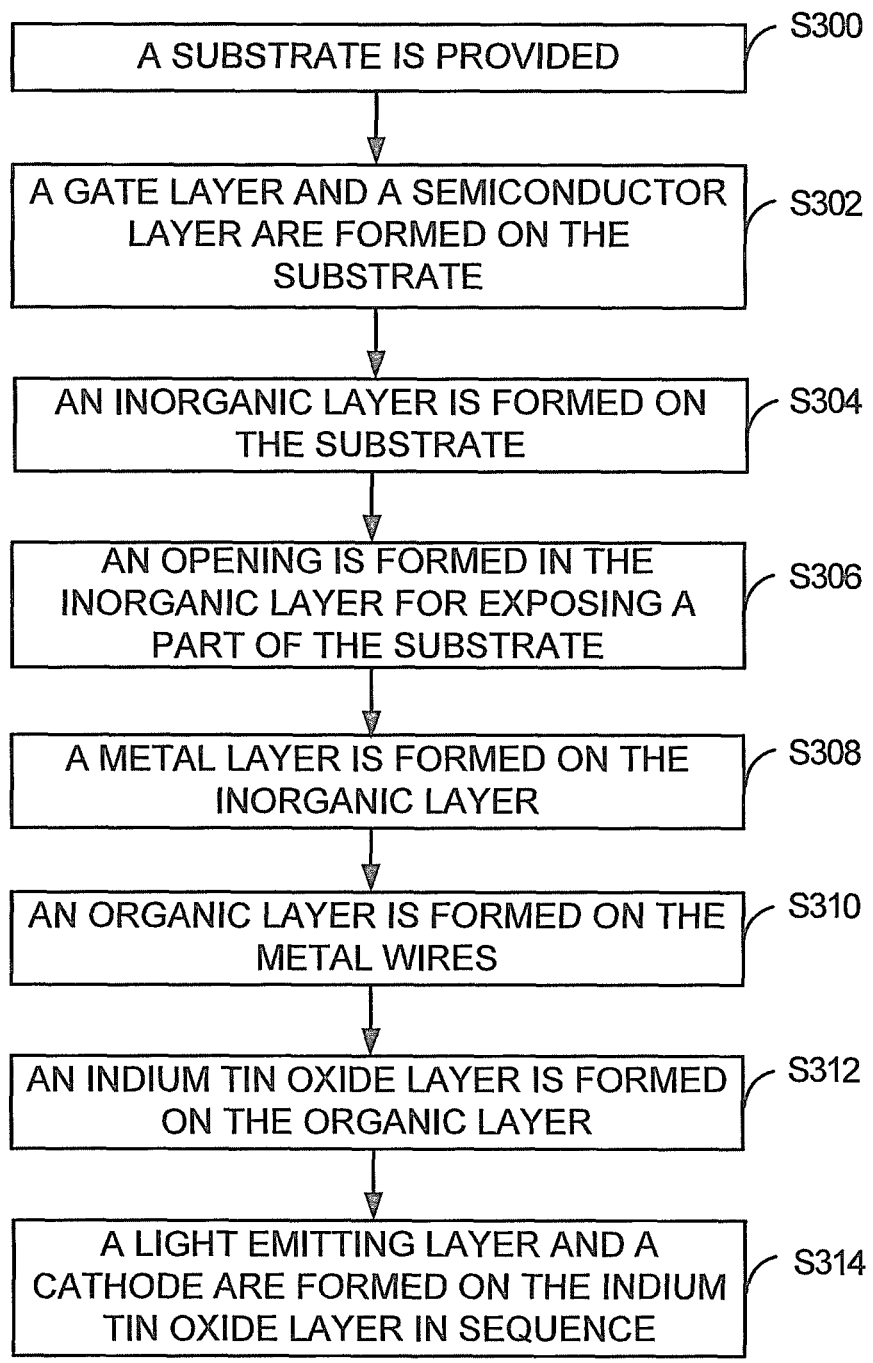
FIG. 3 illustrates a flow chart of a method for preventing a short circuit between metal wires in an organic light emitting diode display device in accordance with an embodiment of the present invention.
Figure 4:
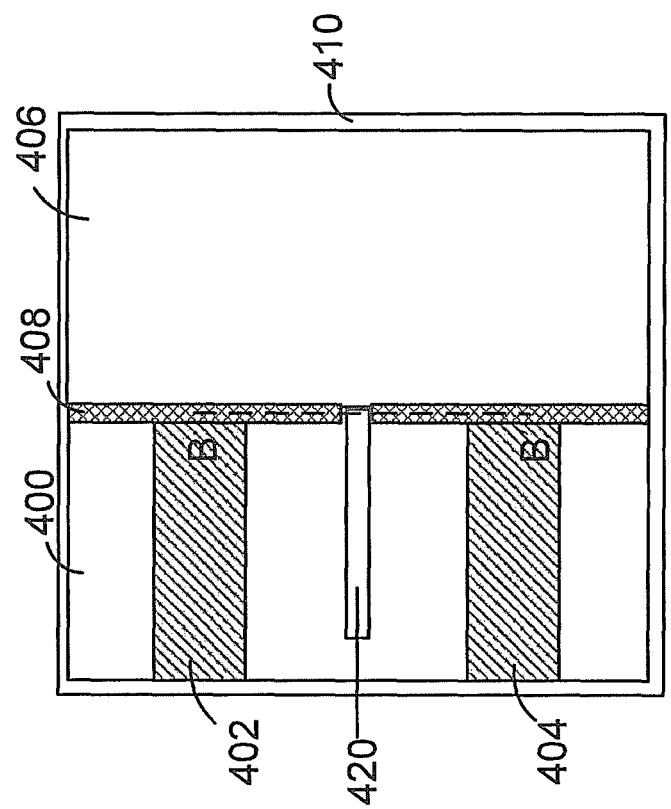
FIG. 4 illustrates a top view of some elements of the organic light emitting diode display device in accordance with the embodiment of the present invention.
Figure 5:
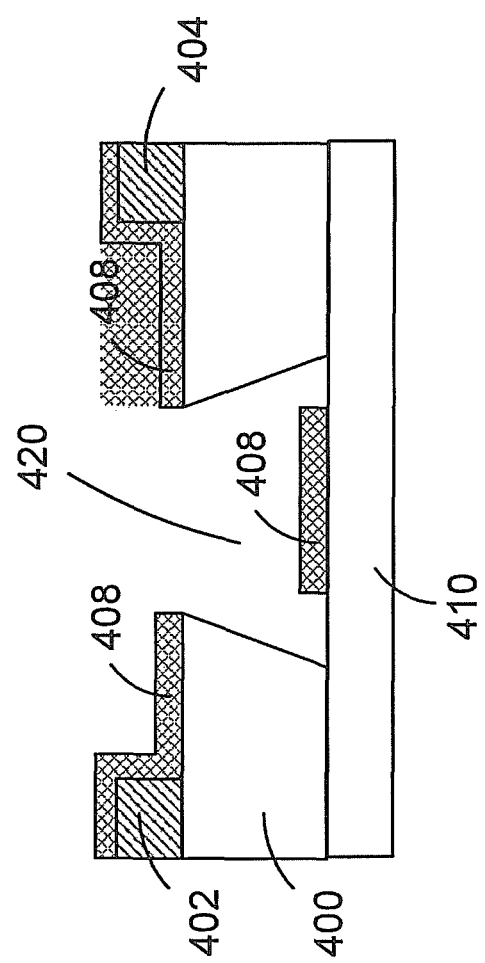
FIG. 5 illustrates a cross-sectional view along a line BB' in FIG. 4.

Please refer to FIG. 3 to FIG. 5. FIG. 3 illustrates a flow chart of a method for preventing a short circuit between metal wires in an organic light emitting diode display device in accordance with an embodiment of the present invention. FIG. 4 illustrates a top view of some elements of the organic light emitting diode display device in accordance with the embodiment of the present invention. FIG. 5 illustrates a cross-sectional view along a line BB' in FIG. 4.

In step S300, a substrate 410 is provided.

In step S302, a gate layer (not shown) and a semiconductor layer (not shown) are formed on the substrate 410.

It is noted that since formation methods of the gate layer (not shown) and the semiconductor layer (not shown) are the same as those in the prior arts and are not key points of the present invention, they are not shown in FIG. 4 and FIG. 5.

In step S304, an inorganic layer 400 is formed on the substrate 410. It is noted that an area of the inorganic layer 400 formed on the substrate 410 is different from an area of the gate layer (not shown) and the semiconductor layer (not shown) formed on the substrate 410.

In step 306, an opening 420 is formed in the inorganic layer 400 for exposing a part of the substrate 410.

Figure 6:
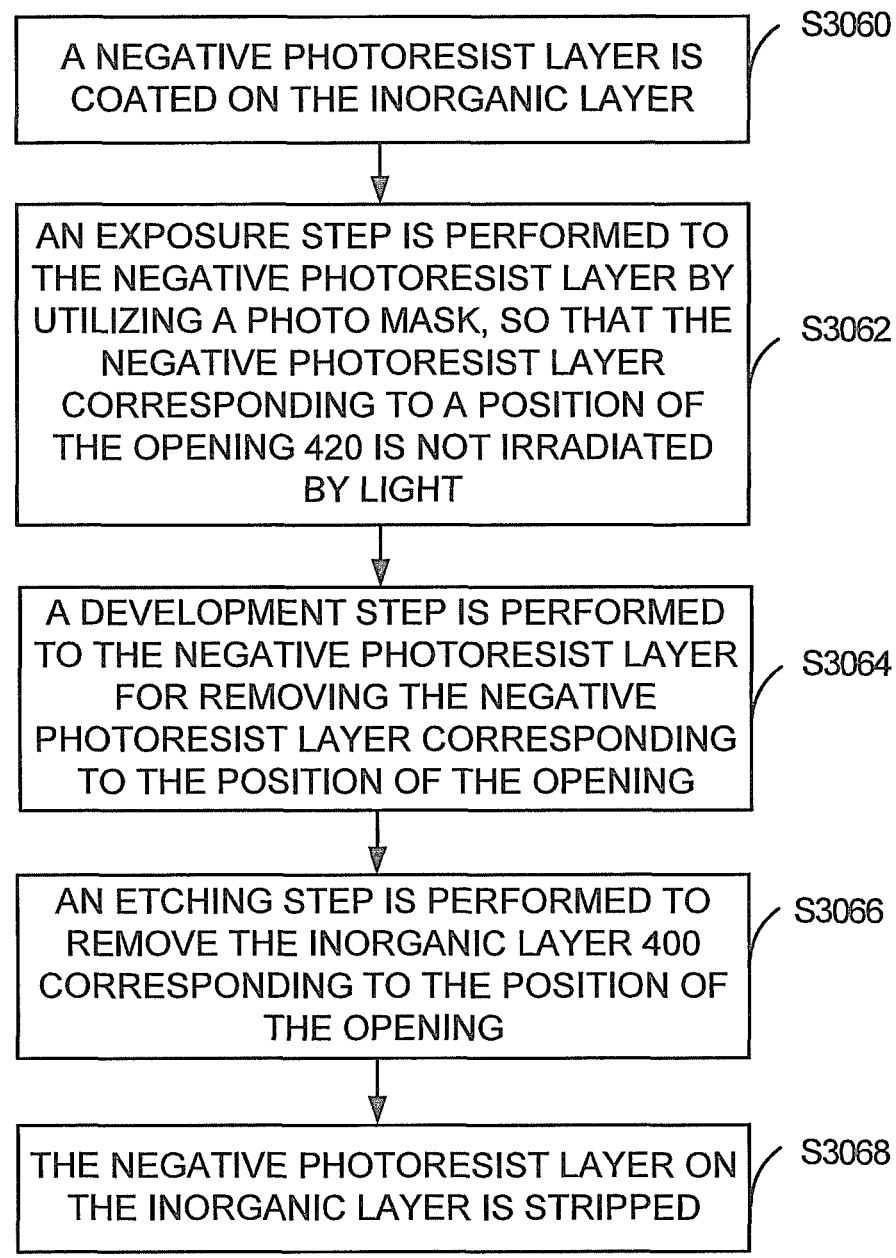
FIG. 6 illustrates specific steps of step S306 in FIG. 5.

Please refer to FIG. 6. FIG. 6 illustrates specific steps of step S306 in FIG. 5.

In step S3060, a negative photoresist layer is coated on the inorganic layer 400.

In step S3062, an exposure step is performed to the negative photoresist layer by utilizing a photo mask, so that the negative photoresist layer corresponding to a position of the opening 420 is not irradiated by light.

In step S3064, a development step is performed to the negative photoresist layer for removing the negative photoresist layer corresponding to the position of the opening 420.

In step S3066, an etching step is performed to remove the inorganic layer 400 corresponding to the position of the opening 420.

In step 3068, the negative photoresist layer on the inorganic layer 400 is stripped.

Since the negative photoresist layer is utilized, the opening 420 has a shape with narrow top and wide bottom as shown in FIG. 5, i.e. has a mushroom structure.

Please refer back to FIG. 3 to FIG. 5. Step S308 is performed after the above-mentioned step S306. In step S308, a metal layer is formed on the inorganic layer 400. The metal layer comprises at least two metal wires 402 and 404 which are served as sources or drains. The metal wires 402 and 404 are respectively positioned at two sides of the opening 420 for transmitting independent signals, that is, for transmitting different signals.

The two metal wires 402 and 404 are, for example, but are not limited to, formed by a wet etching method.

In step S310, an organic layer 406 is formed on the metal wires 402 and 404. The organic layer 406 at least covers a part of the metal wire 402 and a part of the metal wire 404. The organic layer 406 and the inorganic layer 400 are utilized as insulating layers and have a flat function for improving quality of manufacturing an organic light emitting diode in the following process.

In step S312, an indium tin oxide (ITO) layer 408 is formed on the organic layer 406. The indium tin oxide layer 408 is utilized as an anode of the organic light emitting diode.

Figure 1:
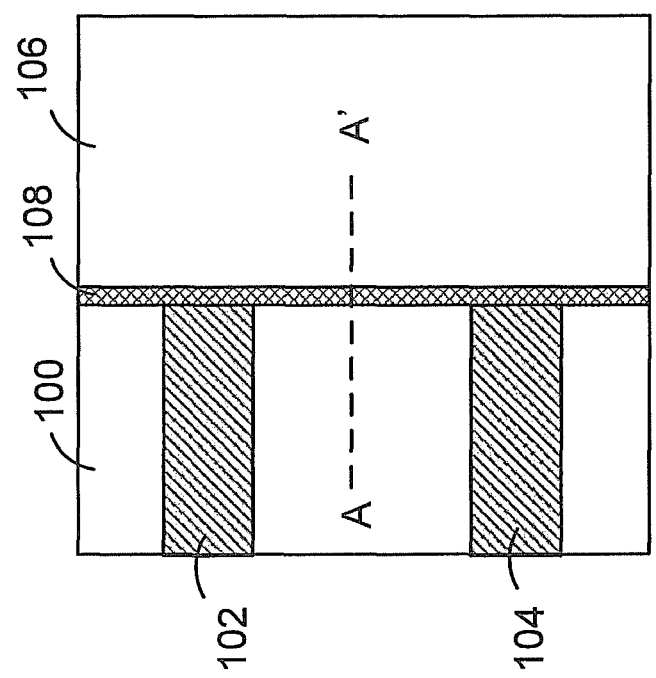
FIG. 1 illustrates a top view of some elements of a conventional organic light emitting diode display device.
Figure 2:
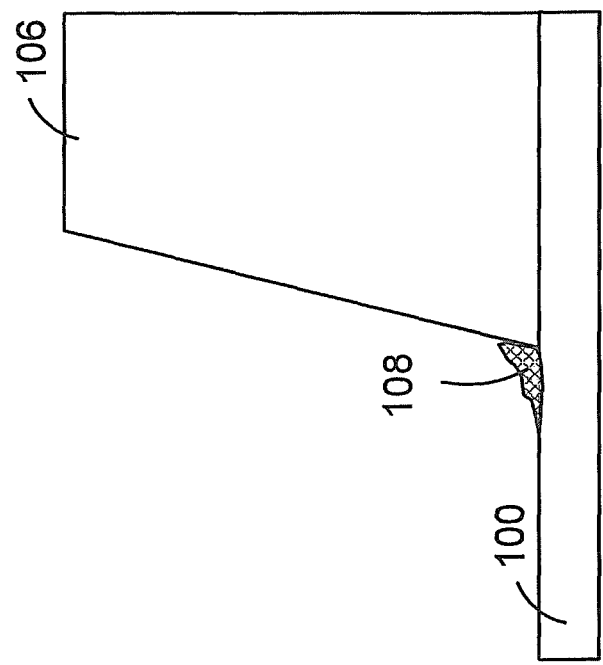
FIG. 2 illustrates a cross-sectional view along a line AA' in FIG. 1.

It is noted that a position of the light emitting diode is formed in a light emitting area (not shown) of the substrate 410, and FIG. 4 and FIG. 5 illustrates a thin film transistor area. The indium tin oxide layer 408 (utilized as the anode of the light emitting diode) is required to be formed only in the light emitting area (not shown), and the indium tin oxide layer 408 is not required to be formed in the thin film transistor area. Accordingly, the indium tin oxide layer 408 in the thin film transistor area is required to be removed. However, due to the shadowing effect in the prior arts, the indium tin oxide layer 408 in the thin film transistor area cannot be completely removed after the exposure step, the development step, and the etching step, so that a fraction of the indium tin oxide layer 408 between a border of the inorganic layer 400 and the organic layer 406 is left (as shown in FIG. 2) and a short circuit occurs between the metal wires 402 and 404. In the present invention, the opening 420 is formed in the inorganic layer 400 (step S306). As a result, when the indium tin oxide layer 408 is formed (step S312), the indium tin oxide layer 408 has a disconnect structure formed in the position of the opening 420. That is, the indium tin oxide layer 408 in FIG. 5 is not a continuous wire. Accordingly, even if the indium tin oxide layer 408 is not completely etched so that the fraction of the indium tin oxide layer 408 is left between the border of the inorganic layer 400 and the organic 406 (as shown in FIG. 2), it can be ensured that the short circuit between the metal wires 402 and 404 does not occur.

In step S314, a light emitting layer (not shown) and a cathode (now shown) are formed on the indium tin oxide layer in the light emitting area (not shown) in sequence for finishing the manufacturing of the organic light emitting diode.

It is noted that since formation methods of the light emitting layer (not shown) and the cathode (not shown) are not key points of the present invention, they are not shown in FIG. 4 and FIG. 5.

As is understood by a person skilled in the art, the foregoing preferred embodiments of the present invention are illustrative rather than limiting of the present invention. It is intended that they cover various modifications and similar arrangements be included within the spirit and scope of the appended claims, the scope of which should be accorded the broadest interpretation so as to encompass all such modifications and similar structure.

What is claimed is:

1. A method for preventing a short circuit between metal wires in an organic light emitting diode display device, comprising:
   forming an inorganic layer on a substrate;
   forming an opening in the inorganic layer for exposing a part of the substrate, the opening having a shape with narrow top and wide bottom;
   forming a metal layer on the inorganic layer, the metal layer comprising two metal wires respectively positioned at two sides of the opening;
   forming an organic layer on the two metal wires of the metal layer, the organic layer at least covering a part of the two metal wires; and
   forming an indium tin oxide layer on the organic layer.

2. The method for preventing the short circuit between the metal wires in the organic light emitting diode display device of claim 1, wherein the step of forming the opening in the inorganic layer for exposing the part of the substrate comprises:
   coating a negative photoresist layer on the inorganic layer;
   performing an exposure step to the negative photoresist layer by utilizing a photo mask, so that the negative photoresist layer corresponding to a position of the opening is not irradiated by light;
   performing a development step to the negative photoresist layer for removing the negative photoresist layer corresponding to the position of the opening; and
   performing an etching step to remove the inorganic layer corresponding to the position of the opening.

3. The method for preventing the short circuit between the metal wires in the organic light emitting diode display device of claim 2, further comprising a step of stripping the negative photoresist layer on the inorganic layer after the step of performing the etching step to remove the inorganic layer corresponding to the position of the opening.

4. The method for preventing the short circuit between the metal wires in the organic light emitting diode display device of claim 1, wherein the two metal wires are utilized as sources.

5. The method for preventing the short circuit between the metal wires in the organic light emitting diode display device of claim 1, wherein the two metal wires are utilized as drains.

6. The method for preventing the short circuit between the metal wires in the organic light emitting diode display device of claim 1, wherein the two metal wires are formed by a wet etching method.

7. A method for preventing a short circuit between metal wires in an organic light emitting diode display device, comprising:
   forming an inorganic layer on a substrate;
   forming an opening in the inorganic layer for exposing a part of the substrate;
   forming a metal layer on the inorganic layer, the metal layer comprising two metal wires respectively positioned at two sides of the opening;
   forming an organic layer on the two metal wires of the metal layer; and
   forming an indium tin oxide layer on the organic layer.

8. The method for preventing the short circuit between the metal wires in the organic light emitting diode display device of claim 7, wherein the step of forming the opening in the inorganic layer for exposing the part of the substrate comprises:
   coating a negative photoresist layer on the inorganic layer;
   performing an exposure step to the negative photoresist layer by utilizing a photo mask, so that the negative photoresist layer corresponding to a position of the opening is not irradiated by light;
   performing a development step to the negative photoresist layer for removing the negative photoresist layer corresponding to the position of the opening; and
   performing an etching step to remove the inorganic layer corresponding to the position of the opening.

9. The method for preventing the short circuit between the metal wires in the organic light emitting diode display device of claim 8, further comprising a step of stripping the negative photoresist layer on the inorganic layer after the step of performing the etching step to remove the inorganic layer corresponding to the position of the opening.

10. The method for preventing the short circuit between the metal wires in the organic light emitting diode display device of claim 7, wherein the two metal wires are utilized as sources.

11. The method for preventing the short circuit between the metal wires in the organic light emitting diode display device of claim 7, wherein the two metal wires are utilized as drains.

12. The method for preventing the short circuit between the metal wires in the organic light emitting diode display device of claim 7, wherein the organic layer at least covers a part of the two metal wires.

13. The method for preventing the short circuit between the metal wires in the organic light emitting diode display device of claim 7, wherein the two metal wires are formed by a wet etching method.

* * * * *